(12) United States Patent
Park et al.

(10) Patent No.: US 8,273,607 B2
(45) Date of Patent: Sep. 25, 2012

(54) INTEGRATED CIRCUIT PACKAGING SYSTEM WITH ENCAPSULATION AND UNDERFILL AND METHOD OF MANUFACTURE THEREOF

(75) Inventors: Soo-San Park, Seoul (KR); Sang-Ho Lee, Yeoju (KR); DaeSik Choi, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 67 days.

(21) Appl. No.: 12/818,462

(22) Filed: Jun. 18, 2010

(65) Prior Publication Data

US 2011/0312133 A1 Dec. 22, 2011

(51) Int. Cl.
*H01L 21/00* (2006.01)

(52) U.S. Cl. ......... 438/127; 438/25; 438/106; 438/108; 257/787; 257/E23.124; 257/E21.503

(58) Field of Classification Search .............. 438/25, 438/106, 108, 125, 126, 127; 257/778, 738, 257/787, E21.501, E21.503, E21.504, E23.124, 257/E23.125, E23.126
See application file for complete search history.

(56) References Cited

U.S. PATENT DOCUMENTS

| | | |
|---|---|---|
| 6,324,069 B1 | 11/2001 | Weber |
| 6,369,449 B2 * | 4/2002 | Farquhar et al. .............. 257/778 |
| 6,451,625 B1 | 9/2002 | Pu et al. |
| 6,560,122 B2 | 5/2003 | Weber |
| 6,610,560 B2 | 8/2003 | Pu et al. |
| 6,772,512 B2 | 8/2004 | Tsai et al. |
| 6,838,313 B2 | 1/2005 | Kumamoto et al. |
| 6,963,142 B2 | 11/2005 | Bolken |
| 7,485,502 B2 | 2/2009 | Jeon et al. |
| 2002/0173074 A1 | 11/2002 | Chun-Jen et al. |
| 2003/0113952 A1 | 6/2003 | Sambasivam et al. |
| 2009/0096112 A1 | 4/2009 | Jeon et al. |

* cited by examiner

*Primary Examiner* — Leonard Chang
(74) *Attorney, Agent, or Firm* — Ishimaru & Associates LLP; Mikio Ishimaru; Stanley M. Chang

(57) ABSTRACT

A method of manufacture of an integrated circuit packaging system includes: providing a package carrier having a dispense port; attaching an integrated circuit to the package carrier and over the dispense port; placing a mold chase over the integrated circuit and on the package carrier, the mold chase having a hole; and forming an encapsulation through the dispense port or the hole, the encapsulation surrounding the integrated circuit including completely filled in a space between the integrated circuit and the package carrier, and in a portion of the hole, the encapsulation having an elevated portion or a removal surface resulting from the elevated portion detached.

16 Claims, 8 Drawing Sheets

INTEGRATED CIRCUIT PACKAGING SYSTEM WITH ENCAPSULATION AND UNDERFILL AND METHOD OF MANUFACTURE THEREOF

TECHNICAL FIELD

The present invention relates generally to an integrated circuit packaging system, and more particularly to a system for an integrated circuit packaging system with encapsulation and underfill.

BACKGROUND ART

Integrated circuits are used in many portable electronic products, such as cell phones, portable computers, voice recorders, etc. as well as in many larger electronic systems, such as cars, planes, industrial control systems, etc. Across virtually all applications, there continues to be demand for reducing the size and increasing performance of the devices. The intense demand is no more visible than in portable electronics that have become so ubiquitous.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Drawbacks of conventional designs include a relatively large footprint of the package on the mounting surface of motherboard. The footprint reflects what is typically the maximum dimension of the package, namely, the x-y dimension of the package. In applications where mounting space is at a premium, such as pagers, portable telephones, and personal computers, among others, a large footprint is undesirable. With the goal of increasing the amount of circuitry in a package, but without increasing the area of the package so that the package does not take up any more space on the circuit board, manufacturers have been stacking two or more die within a single package. Unfortunately, sufficient overlap for electrical interconnects and large footprint top packages have plagued previous stacked package or package on package designs.

Thus, a need still remains for an integrated circuit packaging system to provide reduced area and volume. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package carrier having a dispense port; attaching an integrated circuit to the package carrier and over the dispense port; placing a mold chase over the integrated circuit and on the package carrier, the mold chase having a hole; and forming an encapsulation through the dispense port or the hole, the encapsulation surrounding the integrated circuit including completely filled in a space between the integrated circuit and the package carrier, and in a portion of the hole, the encapsulation having an elevated portion or a removal surface resulting from the elevated portion detached.

The present invention provides an integrated circuit packaging system, including: a package carrier having a dispense port; an integrated circuit attached to the package carrier and over the dispense port; and an encapsulation surrounding the integrated circuit including a space between the integrated circuit and the package carrier, and in a portion of the dispense port, the encapsulation having an elevated portion or a removal surface on a top surface of the encapsulation and resulting from the elevated portion detached.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
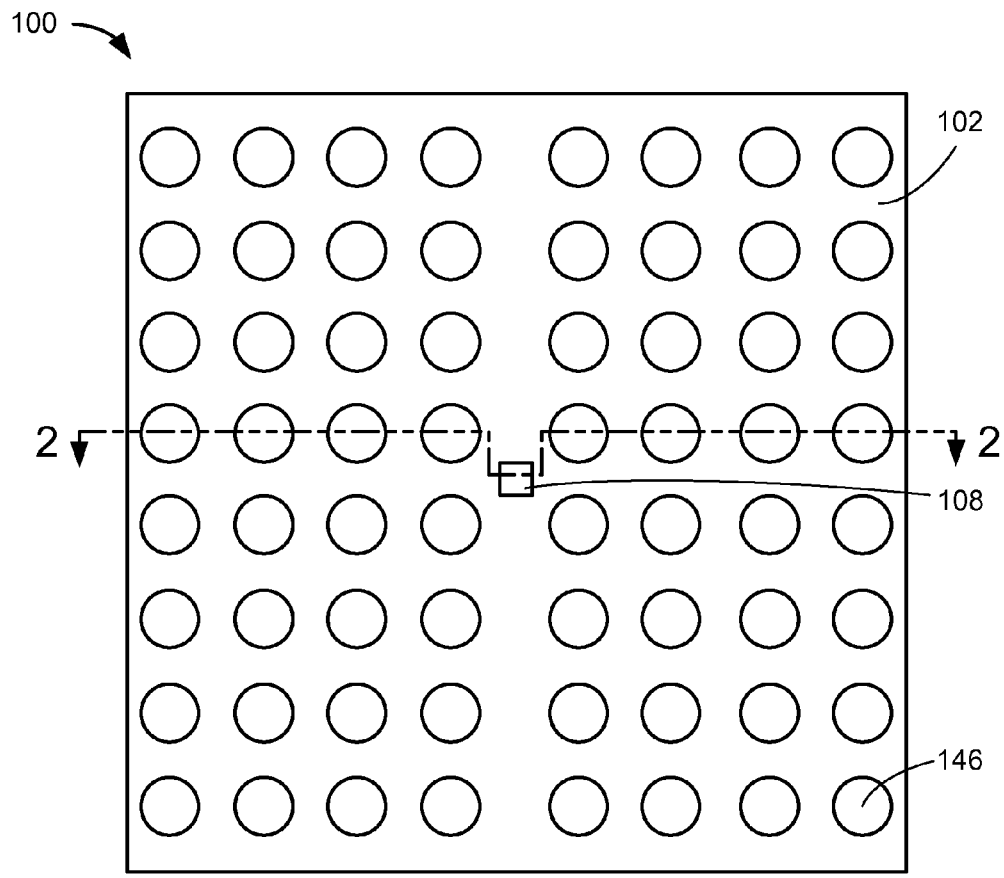
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Conventional packaging systems can require two methods to form an underfill and a molding together in a semiconductor package. An underfill method can include a viscous liquid, which flows under the force of gravity. So, the viscous liquid can be used primarily to protect solder balls under a flip chip when the viscous liquid is solidified. Embodiments of the present invention describe a new molded underfill (MUF) concept that provides a single encapsulation process.

Referring now to FIG. 1, therein is shown a bottom view of an integrated circuit packaging system 100 in a first embodiment of the present invention. The integrated circuit packaging system 100 can include a package carrier 102. The package carrier 102 is for mounting and connecting devices and integrated circuits as part of a finished product to be used in a system.

The package carrier 102 can be a substrate, a leadframe, or a printed circuit board (PCB). For example, the package carrier 102 can be a holed substrate, a laminated substrate, a ceramic substrate. The package carrier 102 can include a dispense port 108, through which a mold material can be injected to form a cover for a semiconductor package.

For illustrative purposes, the dispense port 108 is shown as formed in a shape of a square, although it is understood that the dispense port 108 can be formed in other shapes, as well. For example, the dispense port 108 can be formed in a shape of a circle.

An external interconnect 146 can be attached to the package carrier 102 to provide electrical connectivity to external systems (not shown). For example, the external interconnect 146 can be a conductive ball, a conductive bump, or a conductive connector. The external interconnect 146 can be formed with solder, a metallic alloy, or a conductive material.

The external interconnect 146 can be formed in an area array. For illustrative purposes, the external interconnect 146 is shown as formed in a full area array, although the external interconnect 146 can be formed in a different configuration. For example, the external interconnect 146 can be formed in a peripheral array adjacent to a perimeter of the package carrier 102.

Figure 2:
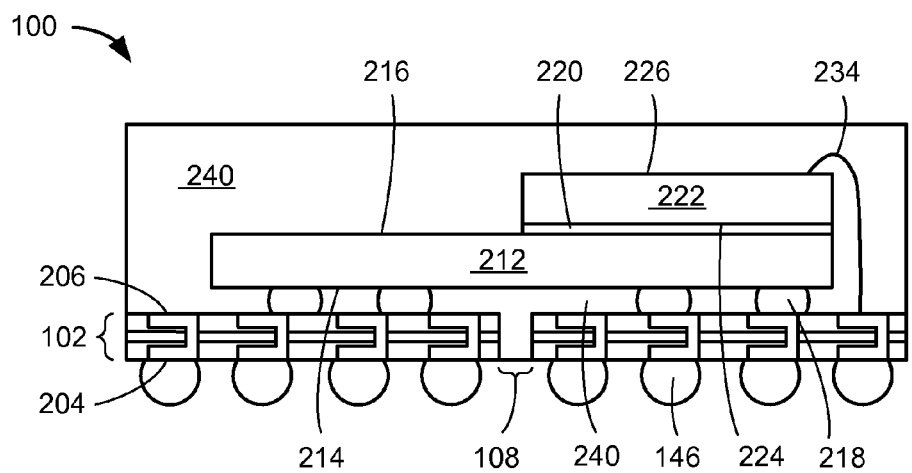
FIG. 2 is a cross-sectional view of the integrated circuit packaging system along a section line 2-2 of FIG. 1.

Referring now to FIG. 2, therein is shown a cross-sectional view of the integrated circuit packaging system 100 along a section line 2-2 of FIG. 1. The package carrier 102 can include a bottom side 204 and a top side 206 at an opposite side to the bottom side 204.

The package carrier 102 can include the dispense port 108 having an opening at the bottom side 204 and the top side 206. For example, the dispense port 108 can be a through hole.

A first integrated circuit 212 can be mounted over the top side 206. For example, the first integrated circuit 212 can be a flip chip, an integrated circuit die, a semiconductor device, or a chip. The first integrated circuit 212 can have a first active side 214 and a first non-active side 216 at an opposite side to the first active side 214. The first active side 214 can face the top side 206.

A first internal interconnect 218 can be electrically connected to the top side 206 and the first active side 214. For example, the first internal interconnect 218 can be a conductive ball, a conductive bump, a wire, or an electrical connector. The first internal interconnect 218 can be formed with solder, a metallic alloy, or a conductive material.

The first non-active side 216 can provide a surface to apply an attach layer 220. For example, the attach layer 220 can be an adhesive, an adhesive film, or a spacer.

A second integrated circuit 222 can be mounted over the first non-active side 216. For example, the second integrated circuit 222 can be a wirebond integrated circuit, an integrated circuit die, or a chip. The second integrated circuit 222 can have a second non-active side 224 and a second active side 226 at an opposite side to the second non-active side 224.

The second non-active side 224 can face the first non-active side 216. The attach layer 220 can attach the first non-active side 216 and the second non-active side 224. A second internal interconnect 234 can be electrically connected to the top side 206 and the second active side 226. For example, the second internal interconnect 234 can be a bond wire, a ribbon bond wire, or a conductive wire.

A mold compound, defined as a material including an epoxy mold compound (EMC), an encapsulant, or a mold material, can be used to form an encapsulation 240, defined as a cover of a semiconductor package that seals electrical components providing mechanical and environmental protection. The encapsulation 240 can be formed over the top side 206. The encapsulation 240 can have high fluid friction or high resistance to flow.

The encapsulation 240 can cover the first integrated circuit 212, the first internal interconnect 218, the second integrated circuit 222, and the second internal interconnect 234. The first integrated circuit 212, the first internal interconnect 218, the second integrated circuit 222, and the second internal interconnect 234 can be surrounded substantially without voids by the encapsulation 240, including a space between the first integrated circuit 212 and the package carrier 102 surrounding the first internal interconnect 218. The encapsulation 240 can be on and around the first integrated circuit 212. A portion of the encapsulation 240 can be formed within the dispense port 108.

The external interconnect 146 can be attached to the bottom side 204. The external interconnect 146 can be adjacent to the dispense port 108.

It has been discovered that the present invention improves rigidity. The encapsulation 240 formed in a space between the package carrier 102 and the first integrated circuit 212 as well as on and around the first integrated circuit 212 and the second integrated circuit 222 has a robust structure with a single material that is cohesive and dense, thereby having improved rigidity.

Figure 3:
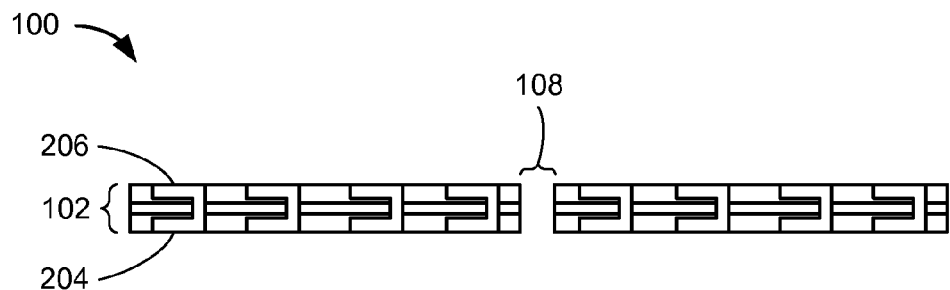
FIG. 3 is a cross-sectional view of the integrated circuit packaging system in a carrier forming phase of a first process flow of manufacture.

Referring now to FIG. 3, therein is shown a cross-sectional view of the integrated circuit packaging system 100 in a carrier forming phase of a first process flow of manufacture. The package carrier 102 can be formed with the dispense port 108 having an opening at the bottom side 204 and the top side 206.

Figure 4:
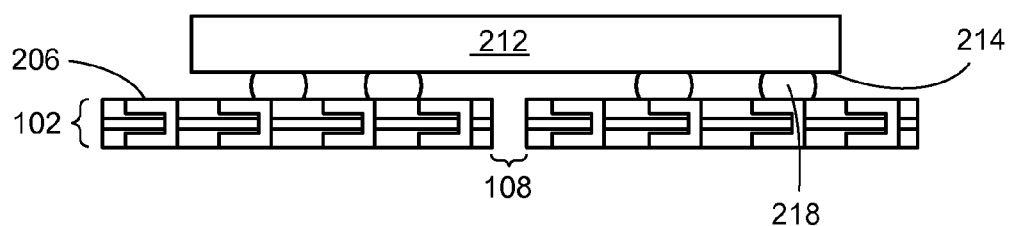
FIG. 4 is the structure of FIG. 3 in a first attaching phase.

Referring now to FIG. 4, therein is shown the structure of FIG. 3 in a first attaching phase. The first integrated circuit 212 can be attached to the package carrier 102. The first active side 214 of the first integrated circuit 212 can be attached to the top side 206 of the package carrier 102 with the first internal interconnect 218. The first integrated circuit 212 can be over the dispense port 108 of the package carrier 102.

Figure 5:
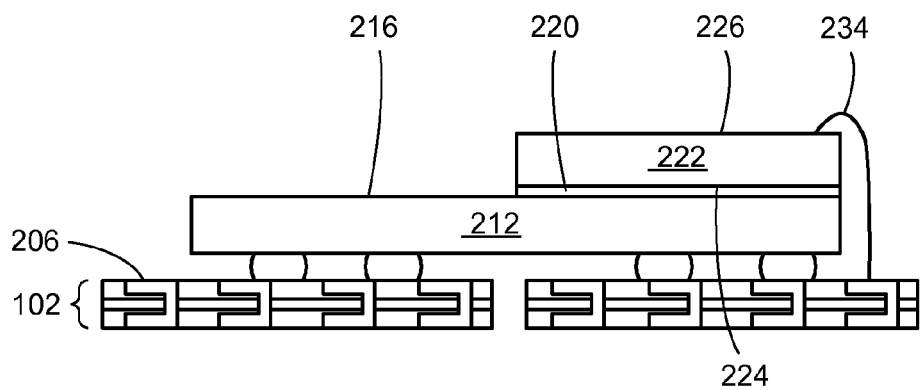
FIG. 5 is the structure of FIG. 4 in a second attaching phase.

Referring now to FIG. 5, therein is shown the structure of FIG. 4 in a second attaching phase. The second integrated circuit 222 can be mounted over the first integrated circuit 212.

The first non-active side 216 of the first integrated circuit 212 can be attached to the second non-active side 224 of the second integrated circuit 222 with the attach layer 220. The second internal interconnect 234 can be connected to the top side 206 of the package carrier 102 and the second active side 226 of the second integrated circuit 222.

The second integrated circuit 222 can have a width, defined as a horizontal dimension from a vertical side of the second integrated circuit 222 to another vertical side of the second integrated circuit 222, less than that of the first integrated circuit 212. The second integrated circuit 222 can be mounted such that a vertical side of the second integrated circuit 222 can be approximately vertically aligned with a vertical side of the first integrated circuit 212.

The second integrated circuit 222 can be mounted in a non-center offset configuration from a center of the first integrated circuit 212. The non-center offset configuration is defined as the second integrated circuit 222 having a center at a horizontal distance away from the center of the first integrated circuit 212.

Figure 6:
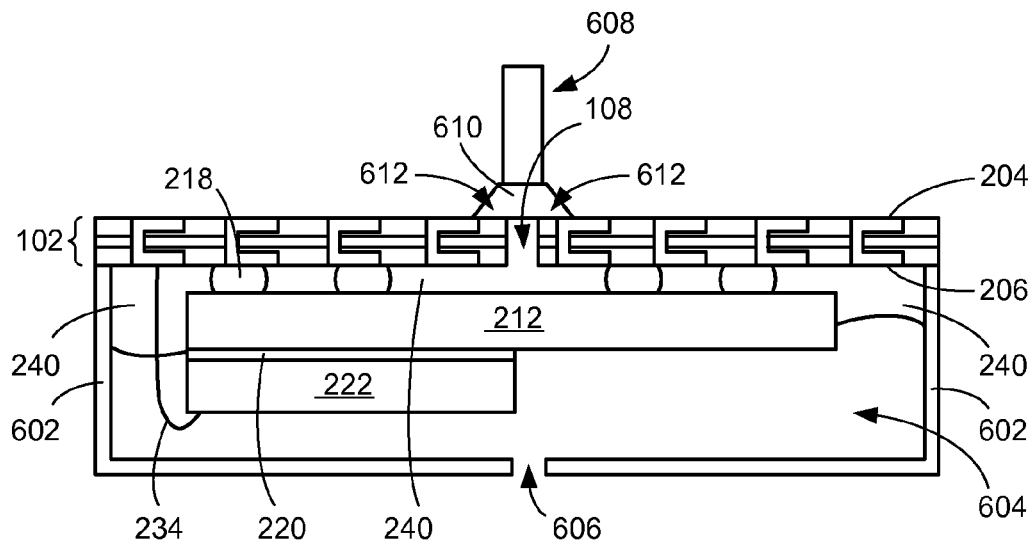
FIG. 6 is the structure of FIG. 5 in a molding phase.

Referring now to FIG. 6, therein is shown the structure of FIG. 5 in a molding phase. A mold chase 602 can be placed on the package carrier 102. The mold chase 602 can be placed over the first integrated circuit 212, the first internal interconnect 218, the second integrated circuit 222, and the second internal interconnect 234.

The mold chase 602 can include a cavity 604. The mold chase 602 can be placed over the top side 206 of the package carrier 102 with the first integrated circuit 212, the first internal interconnect 218, the second integrated circuit 222, and the second internal interconnect 234 within the cavity 604.

The mold chase 602 can optionally include a hole 606. The hole 606 can be a vent hole, to which a vacuum suction (not shown) can be connected. The vacuum suction assists filling performance of the encapsulation 240. The filling performance is a process of injecting the encapsulation 240 to form the cover substantially without voids, which are air pockets or entrapment.

The filling performance can be done with the vacuum suction evacuating air or impurity out of the cavity 604 or a dispense area before injection of the encapsulation 240 occurs, leaving no air pocket or entrapment in the cavity 604 and under the first integrated circuit 212. The hole 606 can be not only at a center portion of the mold chase 602 but also near an edge or at a side of the mold chase 602, based on each package's filling characteristics.

A vacuum pressure in the vacuum can depend on a liquid phase of the encapsulation 240 at a certain temperature. In other words, a viscosity characteristic of the encapsulation 240 can determine the vacuum pressure. The vacuum pressure can determine how consistent or uniform the filling performance of the encapsulation 240 is to fill the space between the package carrier 102 and the mold chase 602.

The package carrier 102 with the first integrated circuit 212, the second integrated circuit 222, and the mold chase 602 attached thereto can be inverted. With the package carrier 102 inverted, the bottom side 204 of the package carrier 102 can face upward.

The dispense port 108 can provide injection of the encapsulation 240 from the bottom side 204 to the top side 206. The encapsulation 240 can be injected through the dispense port 108. The encapsulation 240 can be formed within the dispense port 108.

The encapsulation 240 can be injected with an injection tool 608, defined as an equipment or a system that is used to transfer a mold material under pressure. For example, the injection tool 608 can be a pressurized tool, a transfer tool, or a mold compound injection part of a molding equipment.

The injection tool 608 can include an injection cap 610, defined as a portion at an end of the injection tool 608. The injection cap 610 is used to attach the injection tool 608 to the package carrier 102 before injecting the encapsulation 240. The injection cap 610 can form a tight seal between the injection tool 608 and the package carrier 102 when the injection tool 608 is placed thereon. An injection pressure of the injection tool 608, which is required to fill the space between the package carrier 102 and the mold chase 602, can depend on characteristics of the encapsulation 240 during the liquid phase.

The encapsulation 240 can be injected with the injection tool 608 over the dispense port 108 of the package carrier 102. The encapsulation 240 can be injected into the cavity 604.

The encapsulation 240 can cover the first integrated circuit 212, the first internal interconnect 218, the attach layer 220, the second integrated circuit 222, and the second internal interconnect 234. The encapsulation 240 can be formed within the hole 606.

The encapsulation 240 can be at a carrier exterior portion 612 of the package carrier 102. The carrier exterior portion 612 is a portion of the package carrier 102 around the dispense port 108 and at the bottom side 204.

The encapsulation 240 is different than the underfill that is used by the underfill method. The underfill has a higher viscosity than the encapsulation 240 does in the liquid phase. The encapsulation 240 is less viscous and thus thinner than the underfill. Pressure can be required when injecting the encapsulation 240 through the dispense port 108.

The encapsulation 240 can be in a liquid state when the encapsulation 240 is injected through the dispense port 108 and flow into the cavity 604. The encapsulation 240 can be liquified or softened when the encapsulation 240 is heated.

The encapsulation 240 can have characteristics including viscosity, glass transition temperature (Tg), mold cure temperature, and mold cure time. For example, the viscosity can be in an approximate range of 3 Pascal-seconds (Pa·s) to 100 Pascal-seconds (Pa·s). Also for example, the glass transition temperature can be in an approximate range of 100 degrees Celsius (° C.) to 150 degrees Celsius (° C.).

With temperature raised, bonding forces in the encapsulation 240 can be diminished, resulting in chemical bonds of the encapsulation 240 being broken and the encapsulation 240 becoming less viscous or less thick. When the encapsulation 240 becomes less viscous, the encapsulation 240 can easily flow through the dispense port 108 and between the package carrier 102 and the first integrated circuit 212.

The encapsulation 240 in its liquid state can flow into the cavity 604 filling the space between the package carrier 102 and the mold chase 602. The encapsulation 240 can spread and cover the first integrated circuit 212, the second integrated circuit 222, the dispense port 108, the hole 606, and the space between the package carrier 102 and the first integrated circuit 212.

Curing can be performed to harden the encapsulation 240. Curing can be done at room temperature or a specified temperature to accelerate the cure rate. Once cured, the encapsulation 240 can be solidified.

Chemical bonds of the encapsulation 240 in its solid state can be unbreakable upon subsequent heating. In other words, the encapsulation 240 does not soften once cured.

For example, the mold cure temperature can be in an approximate range of 160 degrees Celsius (° C.) to 190 degrees Celsius (° C.). Also for example, the mold cure time can be in an approximate range of 100 seconds (s) to 200 seconds (s).

If an excess quantity of the encapsulation 240 is injected through the dispense port 108 and into the cavity 604, the encapsulation 240 can flow out of the hole 606. The excess quantity is defined as an amount that is greater than an amount needed to fill the cavity 604, the hole 606, and the dispense port 108. As such, a portion of the encapsulation 240 can be at an exterior of the mold chase 602.

An injected quantity of the encapsulation 240 can be controlled by volume control or monitoring to minimize an overflow of the encapsulation 240. The injected quantity can be less than the amount needed to fill the cavity 604, the hole 606, and the dispense port 108. For example, the encapsulation 240 can cover a portion of the dispense port 108 or a portion of the hole 606.

Figure 7:
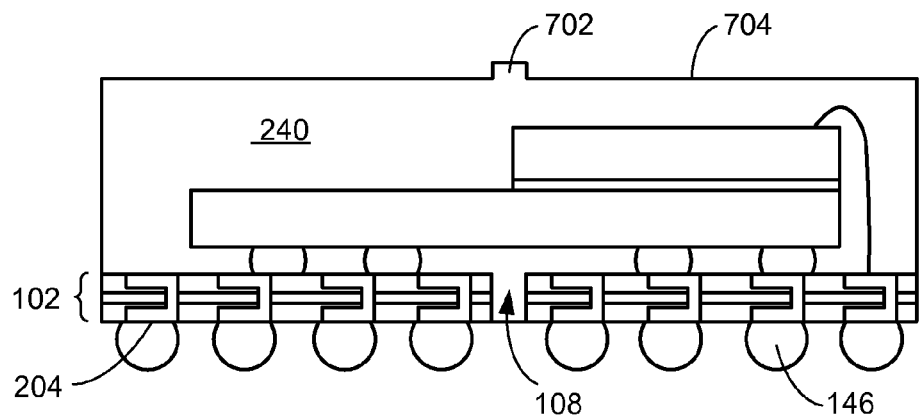
FIG. 7 is the structure of FIG. 6 in an encapsulation exposing phase.

Referring now to FIG. 7, therein is shown the structure of FIG. 6 in an encapsulation exposing phase. The structure is shown as non-inverted and without the mold chase 602 of FIG. 6 and the injection tool 608 of FIG. 6. After the molding phase, the mold chase 602 and the injection tool 608 can be removed.

With the mold chase 602 removed, the encapsulation 240 can be exposed. With the injection tool 608 removed, the encapsulation 240 can be exposed within the dispense port 108 at the bottom side 204 of the package carrier 102.

The encapsulation 240 can include an elevated portion 702 on a top surface 704 of the encapsulation 240. The elevated portion 702 can be formed within the hole 606 of FIG. 6 of the mold chase 602.

The elevated portion 702 can extend from the top surface 704 of the encapsulation 240. The elevated portion 702 can have a size and a shape of a portion of the hole 606.

The external interconnect can be attached to the bottom side 204. The external interconnect 146 can be adjacent to the dispense port 108.

Figure 8:
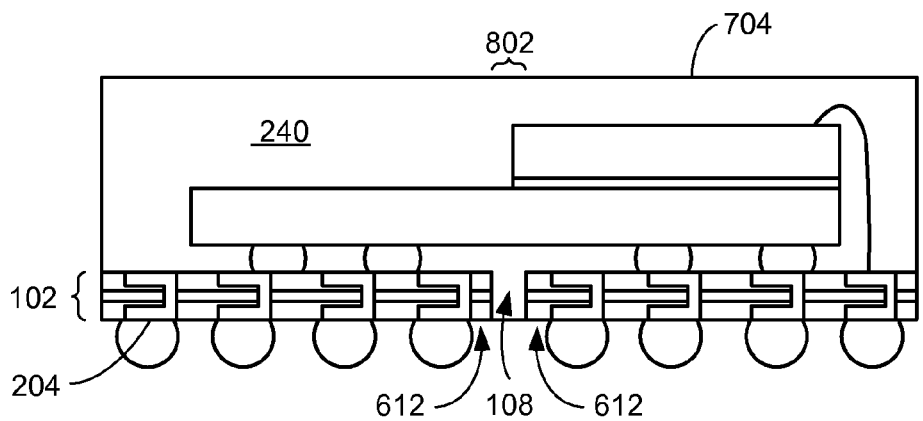
FIG. 8 is the structure of FIG. 7 in a planarizing phase.

Referring now to FIG. 8, therein is shown the structure of FIG. 7 in a planarizing phase. The elevated portion 702 of FIG. 7 of the encapsulation 240 can be removed. The elevated portion 702 can be removed by planarization, grinding, sanding, or any other mechanical or chemical means.

The encapsulation 240 can include a characteristic of being formed with the mold chase 602 of FIG. 6. The characteristic of being formed with the mold chase 602 can include a removal surface 802 resulting from the elevated portion 702 detached. The characteristics can include a planarized mark, a grinding mark, a sanding mark, other removal tool marks, chemical residue, or a chemically processed surface.

After the injection tool 608 of FIG. 6 is removed, a portion of the encapsulation 240 can remain at the carrier exterior portion 612. An area that is covered with the encapsulation 240 at the carrier exterior portion 612 can be substantially the same as a size at an end of the injection cap 610 of FIG. 6. The end of the injection cap 610 is defined as a portion of the injection cap 610 that is in contact with the bottom side 204 when the injection tool 608 is attached to the package carrier 102.

The encapsulation 240 can also include a characteristic of being formed with the injection cap 610 over the dispense port 108. The characteristic of being formed with the injection cap 610 over the dispense port 108 can include a physical feature based on the encapsulation 240 being formed with the end of the injection cap 610 being tightly sealed to the bottom side 204 of the package carrier 102.

The physical feature can include a pressurized mark or an imprint at the carrier exterior portion 612. For example, the injection cap 610 can form an impression at the carrier exterior portion 612 around the dispense port 108.

Figure 9:
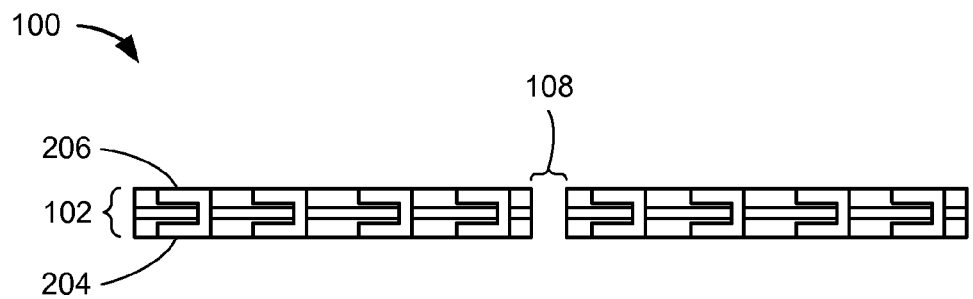
FIG. 9 is a cross-sectional view of the integrated circuit packaging system in a carrier forming phase of a second process flow of manufacture.

Referring now to FIG. 9, therein is shown a cross-sectional view of the integrated circuit packaging system 100 in a carrier forming phase of a second process flow of manufacture. The package carrier 102 can be formed with the dispense port 108 having an opening at the bottom side 204 and the top side 206.

Figure 10:
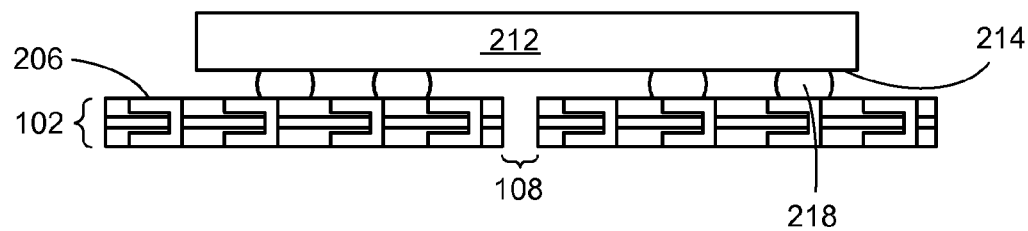
FIG. 10 is the structure of FIG. 9 in a first attaching phase.

Referring now to FIG. 10, therein is shown the structure of FIG. 9 in a first attaching phase. The first integrated circuit 212 can be attached to the package carrier 102. The first active side 214 of the first integrated circuit 212 can be attached to the top side 206 of the package carrier 102 with the first internal interconnect 218. The first integrated circuit 212 can be over the dispense port 108 of the package carrier 102.

Figure 11:
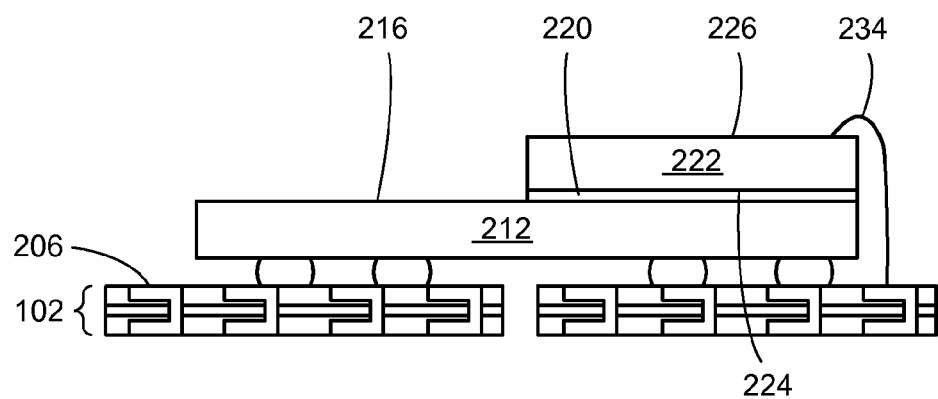
FIG. 11 is the structure of FIG. 10 in a second attaching phase.

Referring now to FIG. 11, therein is shown the structure of FIG. 10 in a second attaching phase. The second integrated circuit 222 can be mounted over the first integrated circuit 212.

The first non-active side 216 of the first integrated circuit 212 can be attached to the second non-active side 224 of the second integrated circuit 222 with the attach layer 220. The second internal interconnect 234 can be connected to the top side 206 of the package carrier 102 and the second active side 226 of the second integrated circuit 222.

The second integrated circuit 222 can have a width, defined as a horizontal dimension from a vertical side of the second integrated circuit 222 to another vertical side of the second integrated circuit 222, less than that of the first integrated circuit 212. The second integrated circuit 222 can be mounted such that a vertical side of the second integrated circuit 222 can be approximately vertically aligned with a vertical side of the first integrated circuit 212.

The second integrated circuit 222 can be mounted in a non-center offset configuration from a center of the first integrated circuit 212. The non-center offset configuration is defined as the second integrated circuit 222 having a center at a horizontal distance away from the center of the first integrated circuit 212.

Figure 12:
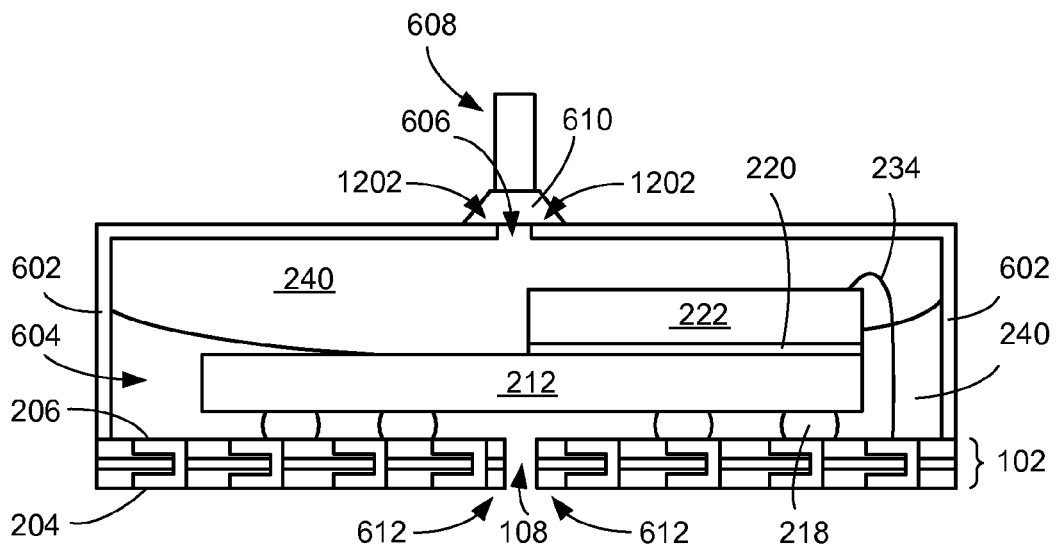
FIG. 12 is the structure of FIG. 11 in a molding phase.

Referring now to FIG. 12, therein is shown the structure of FIG. 11 in a molding phase. The mold chase 602 can be placed on the package carrier 102. The mold chase 602 can be placed over the first integrated circuit 212, the first internal interconnect 218, the second integrated circuit 222, and the second internal interconnect 234.

The mold chase 602 can be placed over the top side 206 of the package carrier 102 with the first integrated circuit 212, the first internal interconnect 218, the second integrated circuit 222, and the second internal interconnect 234 within the cavity 604 of the mold chase 602. The encapsulation 240 can be injected through the hole 606 of the mold chase 602. The hole 606 can be an encapsulation gate at a top, a center, or a side of the mold chase 602.

The encapsulation 240 can be injected with the injection tool 608. The injection cap 610 of the injection tool 608 is used to attach the injection tool 608 to the mold chase 602 before injecting the encapsulation 240. The injection cap 610 can form a tight seal between the injection tool 608 and the mold chase 602 when the injection tool 608 is placed thereon.

The encapsulation 240 can be injected with the injection tool 608 over the hole 606 of the mold chase 602. The encapsulation 240 can be injected into the cavity 604.

The encapsulation 240 can cover the first integrated circuit 212, the first internal interconnect 218, the attach layer 220, the second integrated circuit 222, and the second internal interconnect 234. The encapsulation 240 can be formed within the hole 606.

The encapsulation 240 can be at a chase exterior portion 1202 of the mold chase 602. The chase exterior portion 1202 is a portion of the mold chase 602 around the hole 606.

The encapsulation 240 can be formed within the dispense port 108 of the package carrier 102. The dispense port 108 can be a vent hole, to which a vacuum suction (not shown) can be connected.

The vacuum suction assists filling performance of the encapsulation 240. The vacuum suction can evacuate air or impurity out of the cavity 604 or a dispense area before injection of the encapsulation 240 occurs, leaving no air pocket or entrapment in the cavity 604 and under the first integrated circuit 212.

The encapsulation 240 is different than the underfill that is used by the underfill method. The underfill has a higher viscosity than the encapsulation 240 does in the liquid phase. The encapsulation 240 is less viscous and thus thinner than the underfill. Pressure can be required when injecting the encapsulation 240 through the hole 606.

The encapsulation 240 can be in a liquid state when the encapsulation 240 is injected through the hole 606 and flow into the cavity 604. The encapsulation 240 can be liquified or softened when the encapsulation 240 is heated.

With temperature raised, bonding forces in the encapsulation 240 can be diminished, resulting in chemical bonds of the encapsulation 240 being broken and the encapsulation 240 becoming less viscous or less thick. When the encapsulation 240 becomes less viscous, the encapsulation 240 can easily flow through the hole 606 and between the package carrier 102 and the first integrated circuit 212.

The encapsulation 240 in its liquid state can flow into the cavity 604 filling the space between the package carrier 102 and the mold chase 602. The encapsulation 240 can spread and cover the first integrated circuit 212, the second integrated circuit 222, the dispense port 108, the hole 606, and the space between the package carrier 102 and the first integrated circuit 212.

Curing can be performed to harden the encapsulation 240. Curing can be done at room temperature or a specified temperature to accelerate the cure rate. Once cured, the encapsulation 240 can be solidified.

Chemical bonds of the encapsulation 240 in its solid state can be unbreakable upon subsequent heating. In other words, the encapsulation 240 does not soften once cured.

If an excess quantity of the encapsulation 240 is injected through the hole 606 and into the cavity 604, the encapsulation 240 can flow out of the dispense port 108 at the bottom side 204. The excess quantity is defined as an amount that is greater than an amount needed to fill the cavity 604, the hole 606, and the dispense port 108. As such, a portion of the encapsulation 240 can be at the carrier exterior portion 612.

An injected quantity of the encapsulation 240 can be controlled by volume control or monitoring to minimize an overflow of the encapsulation 240. The injected quantity can be less than the amount needed to fill the cavity 604, the hole 606, and the dispense port 108. For example, the encapsulation 240 can cover a portion of the dispense port 108 or a portion of the hole 606.

Figure 13:
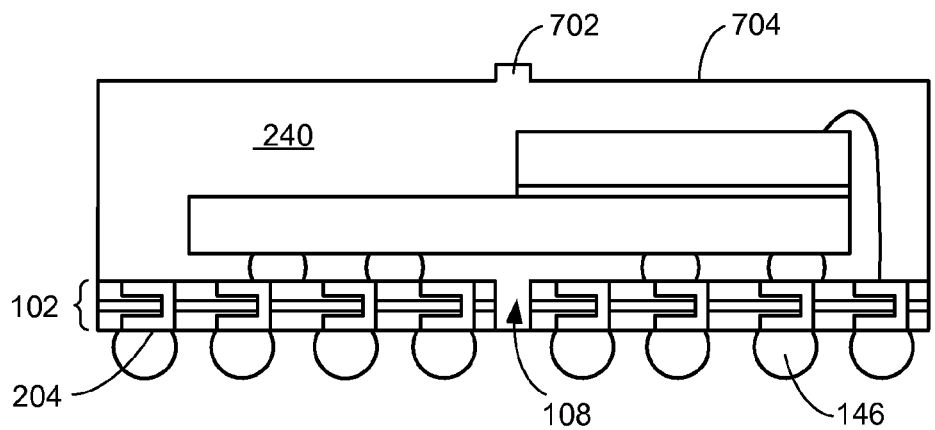
FIG. 13 is the structure of FIG. 12 in an encapsulation exposing phase.

Referring now to FIG. 13, therein is shown the structure of FIG. 12 in an encapsulation exposing phase. The structure is shown without the mold chase 602 of FIG. 12 and the injection tool 608 of FIG. 12. After the molding phase, the mold chase 602 and the injection tool 608 can be removed.

With the mold chase 602 removed, the encapsulation 240 can be exposed. The encapsulation 240 can be exposed within the dispense port 108 at the bottom side 204 of the package carrier 102.

The encapsulation 240 can include the elevated portion 702 on the top surface 704 of the encapsulation 240. The elevated portion 702 can be formed within the hole 606 of FIG. 12 of the mold chase 602.

The elevated portion 702 can extend from the top surface 704 of the encapsulation 240. The elevated portion 702 can have a size and a shape of a portion of the hole 606.

The external interconnect can be attached to the bottom side 204. The external interconnect 146 can be adjacent to the dispense port 108.

Figure 14:
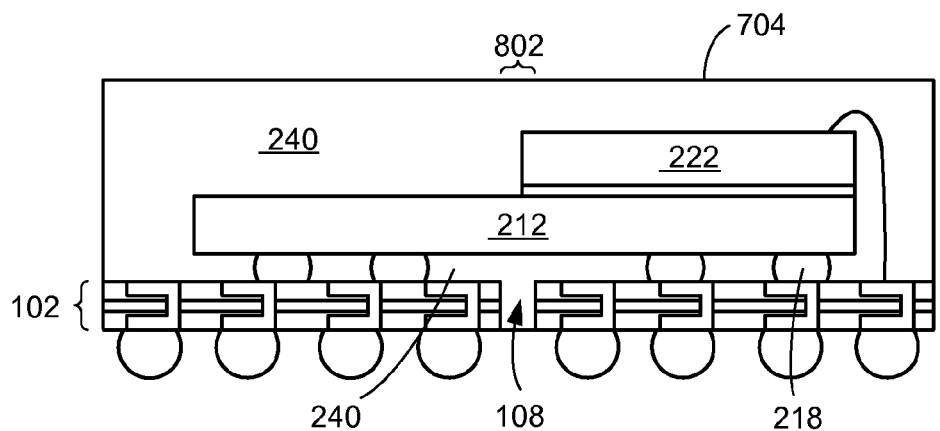
FIG. 14 is the structure of FIG. 13 in a planarizing phase.

Referring now to FIG. 14, therein is shown the structure of FIG. 13 in a planarizing phase. The elevated portion 702 of FIG. 13 of the encapsulation 240 can be removed. The elevated portion 702 can be removed by planarization, grinding, sanding, or any other mechanical or chemical means.

The encapsulation 240 can include a characteristic of being formed with the mold chase 602 of FIG. 12 having the hole 606 of FIG. 12. The characteristic of being formed with the mold chase 602 having the hole 606 can include the removal surface 802 resulting from the elevated portion 702 detached. The characteristics can include a planarized mark, a grinding mark, a sanding mark, other removal tool marks, chemical residue, or a chemically processed surface.

It has been discovered that the present invention provides a molding method, which is different from the underfill method, to form the encapsulation 240. The encapsulation 240 is formed by an injection under pressure through the dispense port 108 of the package carrier 102 or the hole 606 of FIG. 6 of the mold chase 602 of FIG. 6.

It has also been discovered that the encapsulation 240 completely fills a space between the package carrier 102 and the mold chase 602 including a space between the first integrated circuit 212 and the package carrier 102 to significantly reduce voids in the encapsulation 240, eliminate a need for the underfill used in the underfill method, and protect the first internal interconnect 218.

It has been unexpectedly determined that the molding method having the single encapsulation process decreases the number of operations to fabricate packages.

It has been unexpectedly ascertained that the molding method having the single encapsulation process covers the first integrated circuit 212, the second integrated circuit 222, as well as protecting the first internal interconnect 218 in the space between the package carrier 102 and the first integrated circuit 212.

It has also been discovered that the present invention improves the filling performance of the encapsulation 240. With the hole 606 of the mold chase 602 or the dispense port 108 of the package carrier 102 connected to the vacuum suction, the encapsulation 240 easily flows into the cavity 604 of FIG. 6 without any air or impurity, thereby improving the filling performance of the encapsulation 240 and significantly reducing voids between the package carrier 102 and the first integrated circuit 212.

It has further been discovered that the present invention minimizes dispense area for filling a space under the first integrated circuit 212 with the encapsulation 240. The space between the package carrier 102 and the first integrated circuit 212 is filled by injecting the encapsulation 240 through a single dispense gate with either the dispense port 108 or the hole 606, resulting in the dispense area minimized.

Figure 15:
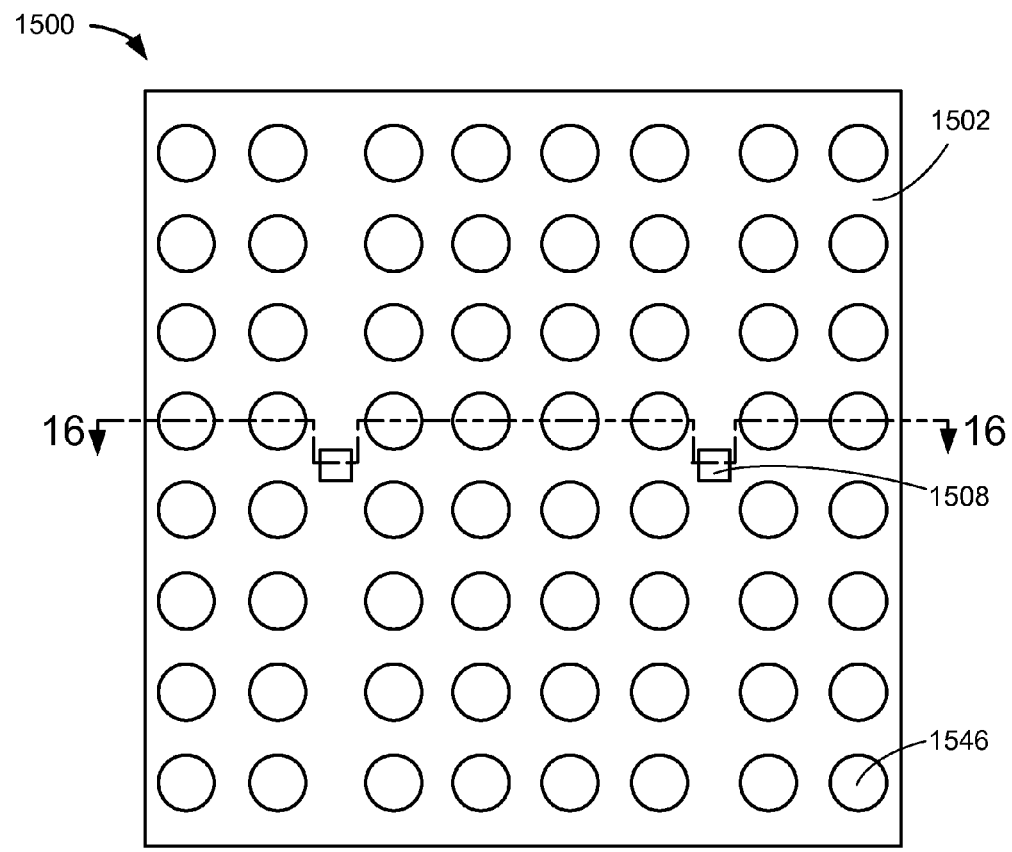
FIG. 15 is a bottom view of an integrated circuit packaging system in a second embodiment of the present invention.

Referring now to FIG. 15, therein is shown a bottom view of an integrated circuit packaging system 1500 in a second embodiment of the present invention. The integrated circuit packaging system 1500 can include a package carrier 1502. The package carrier 1502 is for mounting and connecting devices and integrated circuits as part of a finished product to be used in a system.

The package carrier 1502 can be a substrate, a leadframe, or a printed circuit board (PCB). For example, the package carrier 1502 can be a laminated substrate or a ceramic substrate. The package carrier 1502 can include a number of dispense ports 1508, through which a mold material can be injected to form a cover for a semiconductor package.

For illustrative purposes, the dispense ports 1508 are shown as formed in a shape of a square, although it is understood that the dispense ports 1508 can be formed in other shapes, as well. For example, the dispense ports 1508 can be formed in a shape of a circle.

An external interconnect 1546 can be attached to the package carrier 1502 to provide electrical connectivity to external systems (not shown). For example, the external interconnect 1546 can be a conductive ball, a conductive bump, or a conductive connector. The external interconnect 1546 can be formed with solder, a metallic alloy, or a conductive material.

The external interconnect 1546 can be formed in an area array. For illustrative purposes, the external interconnect 1546 is shown as formed in a full area array, although the external interconnect 1546 can be formed in a different configuration. For example, the external interconnect 1546 can be formed in a peripheral array adjacent to a perimeter of the package carrier 1502.

Figure 16:
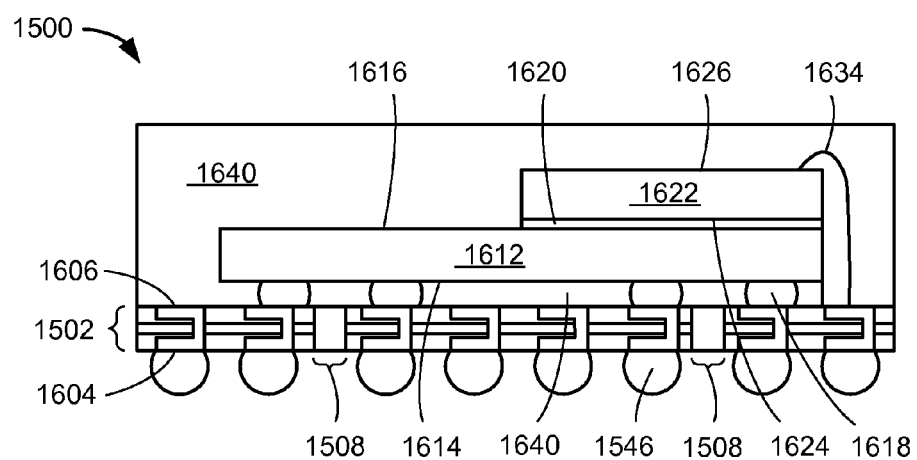
FIG. 16 is a cross-sectional view of the integrated circuit packaging system along a section line 16-16 of FIG. 15.

Referring now to FIG. 16, therein is shown a cross-sectional view of the integrated circuit packaging system 1500 along a section line 16-16 of FIG. 15. The package carrier 1502 can include a bottom side 1604 and a top side 1606 at an opposite side to the bottom side 1604. The package carrier 1502 can include the dispense ports 1508 having openings at the bottom side 1604 and the top side 1606.

A first integrated circuit 1612 can be mounted over the top side 1606. For example, the first integrated circuit 1612 can be a flip chip, an integrated circuit die, a semiconductor device, or a chip. The first integrated circuit 1612 can have a first active side 1614 and a first non-active side 1616 at an opposite side to the first active side 1614. The first active side 1614 can face the top side 1606.

A first internal interconnect 1618 can be electrically connected to the top side 1606 and the first active side 1614. For example, the first internal interconnect 1618 can be a conductive ball, a conductive bump, a wire, or an electrical connector. The first internal interconnect 1618 can be formed with solder, a metallic alloy, or a conductive material.

The first non-active side 1616 can provide a surface to apply an attach layer 1620. For example, the attach layer 1620 can be an adhesive, an adhesive film, or a spacer.

A second integrated circuit 1622 can be mounted over the first non-active side 1616. For example, the second integrated circuit 1622 can be a wirebond integrated circuit, an integrated circuit die, or a chip. The second integrated circuit 1622 can have a second non-active side 1624 and a second active side 1626 at an opposite side to the second non-active side 1624.

The second non-active side 1624 can face the first non-active side 1616. The attach layer 1620 can attach the first non-active side 1616 and the second non-active side 1624. A second internal interconnect 1634 can be electrically connected to the top side 1606 and the second active side 1626. For example, the second internal interconnect 1634 can be a bond wire, a ribbon bond wire, or a conductive wire.

A mold compound, defined as a material including an encapsulant or a mold material, can be used to form an encapsulation 1640, defined as a cover of a semiconductor package that seals electrical components providing mechanical and environmental protection. The encapsulation 1640 can be formed over the top side 1606. The encapsulation 1640 can have high fluid friction or high resistance to flow.

The encapsulation 1640 can cover the first integrated circuit 1612, the first internal interconnect 1618, the second integrated circuit 1622, and the second internal interconnect 1634. The encapsulation 1640 can be on and around the first integrated circuit 1612.

A portion of the encapsulation 1640 can be formed within the dispense ports 1508. For example, the dispense ports 1508 can be multiple injection holes through which the encapsulation 1640 can be injected to fill a space between the top side 1606 of the package carrier 1502 and the first active side 1614 of the first integrated circuit 1612 as well as on and around the first integrated circuit 1612 and the second integrated circuit 1622.

The external interconnect 1546 can be attached to the bottom side 1604. The external interconnect 1546 can be adjacent to the dispense ports 1508.

It has been discovered that the present invention further improves the filling performance of the encapsulation 1640 with more than one of the dispense ports 1508. The filling performance is further improved either by injecting the encapsulation 1640 into multiple of the dispense ports 1508 or connecting multiple of the dispense ports 1508 to the vacuum suction.

Figure 17:
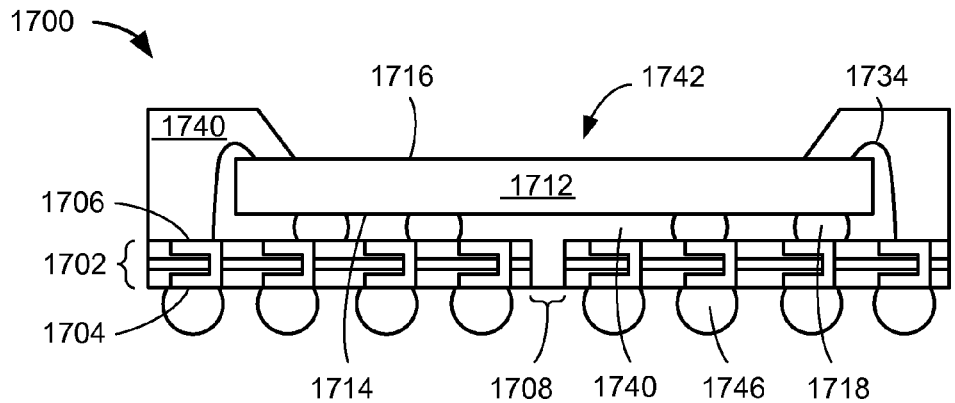
FIG. 17 is a cross-sectional view similar to FIG. 2 of an integrated circuit packaging system in a third embodiment of the present invention.

Referring now to FIG. 17, therein is shown a cross-sectional view similar to FIG. 2 of an integrated circuit packaging system 1700 in a third embodiment of the present invention. The integrated circuit packaging system 1700 can represent a configuration or an application of a packaging system, which can include a fan-in package-on-package (Fi-POP).

The integrated circuit packaging system 1700 can include a package carrier 1702. The package carrier 1702 is for mounting and connecting devices and integrated circuits as part of a finished product to be used in a system.

The package carrier 1702 can include a bottom side 1704 and a top side 1706 at an opposite side to the bottom side 1704. The package carrier 1702 can be a substrate, a leadframe, or a printed circuit board (PCB). For example, the package carrier 1702 can be a laminated substrate or a ceramic substrate.

The package carrier 1702 can include a dispense port 1708, through which a mold material can be injected to form a cover for a semiconductor package. The dispense port 1708 can have an opening at the bottom side 1704 and the top side 1706. For example, the dispense port 1708 can be a through hole.

An integrated circuit 1712 can be mounted over the top side 1706. For example, the integrated circuit 1712 can be a flip chip, an integrated circuit die, a semiconductor device, or a chip. Also for example, the integrated circuit 1712 can be a redistribution layer (RDL) chip.

The integrated circuit 1712 can have an active side 1714 and a non-active side 1716 at an opposite side to the active side 1714. The active side 1714 can face the top side 1706. The integrated circuit 1712 can include a redistribution layer (RDL) at the non-active side 1716.

A first internal interconnect 1718 can be electrically connected to the top side 1706 and the active side 1714. For example, the first internal interconnect 1718 can be a conductive ball, a conductive bump, a wire, or an electrical connector. The first internal interconnect 1718 can be formed with solder, a metallic alloy, or a conductive material.

A second internal interconnect 1734 can be electrically connected to the top side 1706 and the non-active side 1716. For example, the second internal interconnect 1734 can be a bond wire, a ribbon bond wire, or a conductive wire. The second internal interconnect 1734 can electrically connect the top side 1706 and the redistribution layer (RDL) at the non-active side 1716.

A mold compound, defined as a material including an encapsulant or a mold material, can be used to form an encapsulation 1740, defined as a cover of a semiconductor package that seals electrical components providing mechanical and environmental protection. The encapsulation 1740 can be formed over the top side 1706. The encapsulation 1740 can have high fluid friction or high resistance to flow.

The encapsulation 1740 can cover a portion of the integrated circuit 1712, the first internal interconnect 1718, and the second internal interconnect 1734. The encapsulation 1740 can be on and around a portion of the integrated circuit 1712. A portion of the encapsulation 1740 can be formed within the dispense port 1708.

The encapsulation 1740 can include a cavity 1742. The redistribution layer (RDL) at the non-active side 1716 can be partially exposed within the cavity 1742 for electrically connecting to an external packaging system (not shown) mounted thereon.

An external interconnect 1746 can be attached to the package carrier 1702 to provide electrical connectivity to external systems (not shown). For example, the external interconnect 1746 can be a conductive ball, a conductive bump, or a conductive connector. The external interconnect 1746 can be formed with solder, a metallic alloy, or a conductive material.

The external interconnect 1746 can be attached to the bottom side 1704. The external interconnect 1746 can be adjacent to the dispense port 1708.

It has been discovered that the present invention improves interconnectivity with the encapsulation 1740 having the cavity 1742 that partially exposes the integrated circuit 1712 to connect an external packaging system mounted thereon.

Figure 18:
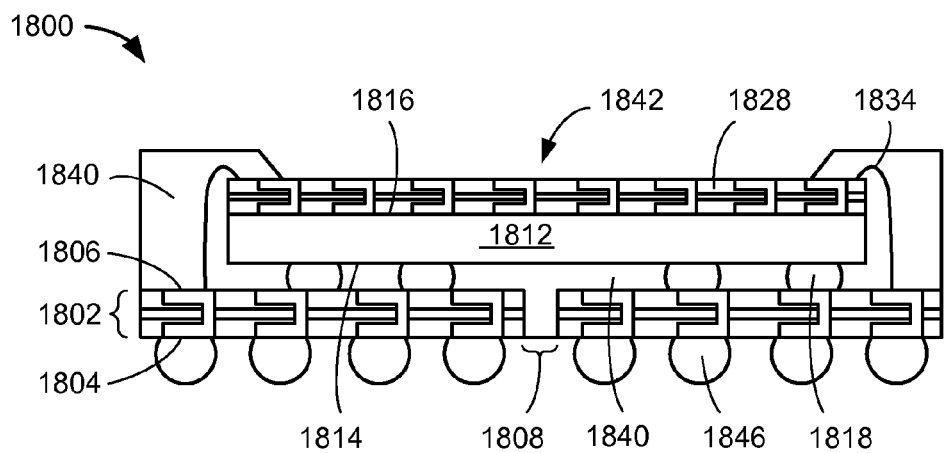
FIG. 18 is a cross-sectional view similar to FIG. 2 of an integrated circuit packaging system in a fourth embodiment of the present invention.

Referring now to FIG. 18, therein is shown a cross-sectional view similar to FIG. 2 of an integrated circuit packaging system 1800 in a fourth embodiment of the present invention. The integrated circuit packaging system 1800 can represent a configuration or an application of a packaging system, which can include a fan-in package-on-package (Fi-POP).

The integrated circuit packaging system 1800 can include a package carrier 1802. The package carrier 1802 is for mounting and connecting devices and integrated circuits as part of a finished product to be used in a system.

The package carrier 1802 can include a bottom side 1804 and a top side 1806 at an opposite side to the bottom side 1804. The package carrier 1802 can be a substrate, a leadframe, or a printed circuit board (PCB). For example, the package carrier 1802 can be a laminated substrate or a ceramic substrate.

The package carrier 1802 can include a dispense port 1808, through which a mold material can be injected to form a cover for a semiconductor package. The dispense port 1808 can have an opening at the bottom side 1804 and the top side 1806. For example, the dispense port 1808 can be a through hole.

An integrated circuit 1812 can be mounted over the top side 1806. For example, the integrated circuit 1812 can be a flip chip, an integrated circuit die, a semiconductor device, or a chip. The integrated circuit 1812 can have an active side 1814 and a non-active side 1816 at an opposite side to the active side 1814. The active side 1814 can face the top side 1806.

A first internal interconnect 1818 can be electrically connected to the top side 1806 and the active side 1814. For example, the first internal interconnect 1818 can be a conductive ball, a conductive bump, a wire, or an electrical connector. The first internal interconnect 1818 can be formed with solder, a metallic alloy, or a conductive material.

An interposer 1828 can be mounted over the non-active side 1816. For example, the interposer 1828 can be an internal stacking module (ISM) or an interface module. The interposer 1828 can include functions for stacking or interconnecting integrated circuit packaging systems.

The interposer 1828 can include a silicon wafer, a substrate, a through-silicon via (TSV), or any combination thereof. A second internal interconnect 1834 can be electrically connected to the top side 1806 and the interposer 1828. For example, the second internal interconnect 1834 can be a bond wire, a ribbon bond wire, or a conductive wire.

A mold compound, defined as a material including an encapsulant or a mold material, can be used to form an encapsulation 1840, defined as a cover of a semiconductor package that seals electrical components providing mechanical and environmental protection. The encapsulation 1840 can be formed over the top side 1806. The encapsulation 1840 can have high fluid friction or high resistance to flow.

The encapsulation 1840 can cover the integrated circuit 1812, the first internal interconnect 1818, a portion of the interposer 1828, and the second internal interconnect 1834. The encapsulation 1840 can be on and around the integrated circuit 1812. A portion of the encapsulation 1840 can be formed within the dispense port 1808.

The interposer 1828 can be partially exposed from the encapsulation 1840. The encapsulation 1840 can include a cavity 1842. The interposer 1828 can be partially exposed within the cavity 1842 for electrically connecting to an external packaging system (not shown) mounted thereon.

An external interconnect 1846 can be attached to the package carrier 1802 to provide electrical connectivity to external systems (not shown). For example, the external interconnect 1846 can be a conductive ball, a conductive bump, or a conductive connector. The external interconnect 1846 can be formed with solder, a metallic alloy, or a conductive material.

The external interconnect 1846 can be attached to the bottom side 1804. The external interconnect 1846 can be adjacent to the dispense port 1808.

It has been discovered that the present invention also improves interconnectivity with the encapsulation 1840 having the cavity 1842 that partially exposes the interposer 1828 to connect an external packaging system mounted thereon.

Figure 19:
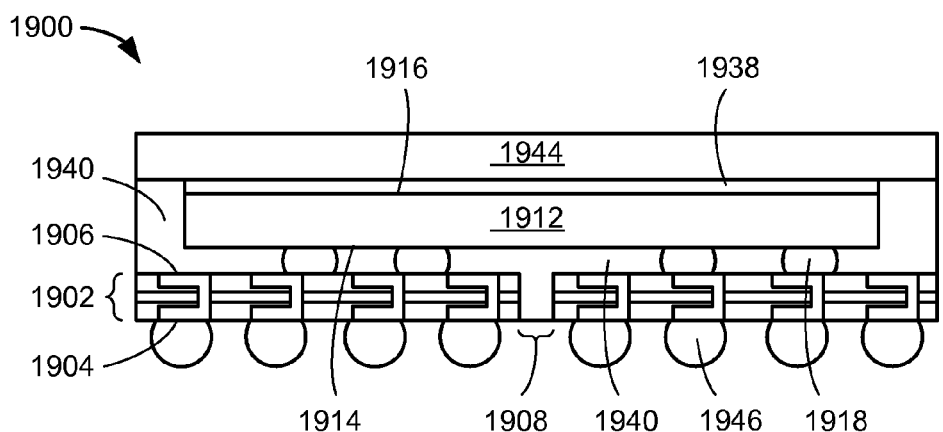
FIG. 19 is a cross-sectional view similar to FIG. 2 of an integrated circuit packaging system in a fifth embodiment of the present invention.

Referring now to FIG. 19, therein is shown a cross-sectional view similar to FIG. 2 of an integrated circuit packaging system 1900 in a fifth embodiment of the present invention. The integrated circuit packaging system 1900 can represent a configuration or an application of a packaging system, which can include a heat slug.

The integrated circuit packaging system 1900 can include a package carrier 1902. The package carrier 1902 is for mounting and connecting devices and integrated circuits as part of a finished product to be used in a system.

The package carrier 1902 can include a bottom side 1904 and a top side 1906 at an opposite side to the bottom side 1904. The package carrier 1902 can be a substrate, a leadframe, or a printed circuit board (PCB). For example, the package carrier 1902 can be a laminated substrate or a ceramic substrate.

The package carrier 1902 can include a dispense port 1908, through which a mold material can be injected to form a cover for a semiconductor package. The dispense port 1908 can have an opening at the bottom side 1904 and the top side 1906. For example, the dispense port 1908 can be a through hole.

An integrated circuit 1912 can be mounted over the top side 1906. For example, the integrated circuit 1912 can be a flip chip, an integrated circuit die, a semiconductor device, or a chip. The integrated circuit 1912 can have an active side 1914 and a non-active side 1916 at an opposite side to the active side 1914. The active side 1914 can face the top side 1906.

An internal interconnect 1918 can be electrically connected to the top side 1906 and the active side 1914. For example, the internal interconnect 1918 can be a conductive ball, a conductive bump, a wire, or an electrical connector. The internal interconnect 1918 can be formed with solder, a metallic alloy, or a conductive material.

An adhesive 1938 can be attached to the non-active side 1916. For example, the adhesive 1938 can be a heat slug adhesive, a thermal adhesive, or a thermally conductive gel.

A mold compound, defined as a material including an encapsulant or a mold material, can be used to form an encapsulation 1940, defined as a cover of a semiconductor package that seals electrical components providing mechanical and environmental protection. The encapsulation 1940 can be formed over the top side 1906. The encapsulation 1940 can have high fluid friction or high resistance to flow.

The encapsulation 1940 can cover the integrated circuit 1912, the internal interconnect 1918, and a portion of the adhesive 1938. The encapsulation 1940 can be on and around the integrated circuit 1912. A portion of the encapsulation 1940 can be formed within the dispense port 1908.

A heat sink 1944 can be mounted over the encapsulation 1940 and an upper surface of the adhesive 1938, which is not covered by the encapsulation 1940. For example, the heat sink 1944 can be a heat slug or a heat spreader. The heat sink 1944 can be attached to the integrated circuit 1912 with the adhesive 1938 to provide a thermal path to conduct heat away from the integrated circuit 1912.

An external interconnect 1946 can be attached to the package carrier 1902 to provide electrical connectivity to external systems (not shown). For example, the external interconnect 1946 can be a conductive ball, a conductive bump, or a conductive connector. The external interconnect 1946 can be formed with solder, a metallic alloy, or a conductive material.

The external interconnect 1946 can be attached to the bottom side 1904. The external interconnect 1946 can be adjacent to the dispense port 1908.

It has been discovered that the present invention improves heat dissipation with the heat sink 1944 over the encapsulation 1940 and attached to the integrated circuit 1912. The heat sink 1944 conducts heat away from the integrated circuit 1912, thereby improving the heat dissipation.

Figure 20:
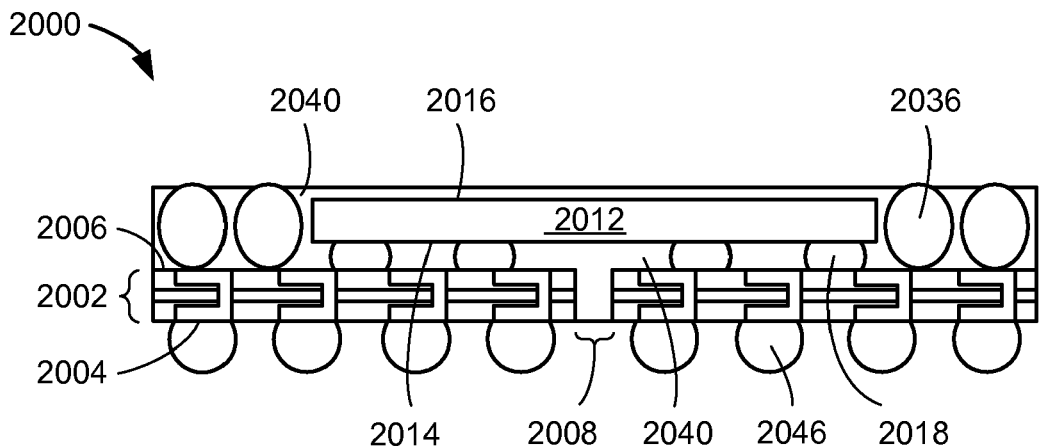
FIG. 20 is a cross-sectional view similar to FIG. 2 of an integrated circuit packaging system in a sixth embodiment of the present invention.

Referring now to FIG. 20, therein is shown a cross-sectional view similar to FIG. 2 of an integrated circuit packaging system 2000 in a sixth embodiment of the present invention. The integrated circuit packaging system 2000 can represent a configuration or an application of a packaging system, which can include an exposed solder-on-pad package-on-package (eSOP-POP).

The integrated circuit packaging system 2000 can include a package carrier 2002. The package carrier 2002 is for mounting and connecting devices and integrated circuits as part of a finished product to be used in a system.

The package carrier 2002 can include a bottom side 2004 and a top side 2006 at an opposite side to the bottom side 2004. The package carrier 2002 can be a substrate, a leadframe, or a printed circuit board (PCB). For example, the package carrier 2002 can be a laminated substrate or a ceramic substrate.

The package carrier 2002 can include a dispense port 2008, through which a mold material can be injected to form a cover for a semiconductor package. The dispense port 2008 can have an opening at the bottom side 2004 and the top side 2006. For example, the dispense port 2008 can be a through hole.

An integrated circuit 2012 can be mounted over the top side 2006. For example, the integrated circuit 2012 can be a flip chip, an integrated circuit die, a semiconductor device, or a chip. The integrated circuit 2012 can have an active side 2014 and a non-active side 2016 at an opposite side to the active side 2014. The active side 2014 can face the top side 2006.

An internal interconnect 2018 can be electrically connected to the top side 2006 and the active side 2014. For example, the internal interconnect 2018 can be a conductive ball, a conductive bump, a wire, or an electrical connector. The internal interconnect 2018 can be formed with solder, a metallic alloy, or a conductive material.

An exposed interconnect 2036 can be attached and electrically connected to the top side 2006 to provide electrical connectivity to external systems (not shown) mounted thereon. For example, the exposed interconnect 2036 can be an exposed solder-on-pad (eSOP), a conductive bump, a conductive ball, a conductive post, a conductive pillar, or a conductive connector. The exposed interconnect 2036 can be formed with solder, a metallic alloy, or a conductive material.

The exposed interconnect 2036 can be adjacent to the integrated circuit 2012. The integrated circuit 2012 can be surrounded by the exposed interconnect 2036.

A mold compound, defined as a material including an encapsulant or a mold material, can be used to form an encapsulation 2040, defined as a cover of a semiconductor package that seals electrical components providing mechanical and environmental protection. The encapsulation 2040 can be formed over the top side 2006. The encapsulation 2040 can have high fluid friction or high resistance to flow.

The encapsulation 2040 can cover the integrated circuit 2012, the internal interconnect 2018, and a portion of the exposed interconnect 2036. The encapsulation 2040 can be on and around the integrated circuit 2012. A portion of the encapsulation 2040 can be formed within the dispense port 2008. The encapsulation 2040 can expose a portion of the exposed interconnect 2036.

An external interconnect 2046 can be attached to the package carrier 2002 to provide electrical connectivity to external systems (not shown). For example, the external interconnect 2046 can be a conductive ball, a conductive bump, or a conductive connector. The external interconnect 2046 can be formed with solder, a metallic alloy, or a conductive material.

The external interconnect 2046 can be attached to the bottom side 2004. The external interconnect 2046 can be adjacent to the dispense port 2008.

It has been discovered that the present invention further improves interconnectivity with the encapsulation 2040 partially exposing the exposed interconnect 2036 to connect an external packaging system mounted thereon.

Figure 21:
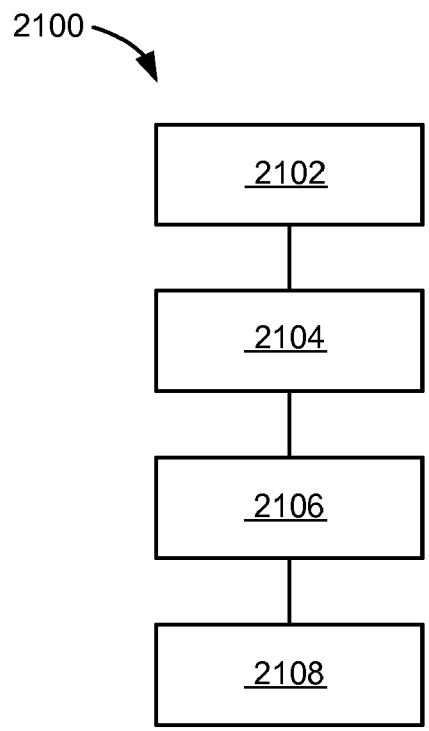
FIG. 21 is a flow chart of a method of manufacture of the integrated circuit packaging system in a further embodiment of the present invention.

Referring now to FIG. 21, therein is shown a flow chart of a method 2100 of manufacture of the integrated circuit packaging system 100 in a further embodiment of the present invention. The method 2100 includes: providing a package carrier having a dispense port in a block 2102; attaching an integrated circuit to the package carrier and over the dispense port in a block 2104; placing a mold chase over the integrated circuit and on the package carrier, the mold chase having a hole in a block 2106; and forming an encapsulation through the dispense port or the hole, the encapsulation surrounding the integrated circuit including completely filled in a space between the integrated circuit and the package carrier, and in a portion of the hole, the encapsulation having an elevated portion or a removal surface resulting from the elevated portion detached in a block 2108.

The present invention can include an integrated circuit packaging system that can encapsulate various and difficult package shapes.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a package carrier having a dispense port;
    attaching an integrated circuit to the package carrier and over the dispense port;
    placing a mold chase over the integrated circuit and on the package carrier, the mold chase having a hole;
    forming an encapsulation through the dispense port or the hole, the encapsulation surrounding the integrated circuit including completely filled in a space between the integrated circuit and the package carrier, and in a portion of the hole, the encapsulation having an elevated portion or a removal surface resulting from the elevated portion detached; and
    wherein:
    forming the encapsulation includes injecting the encapsulation through the dispense port, the encapsulation having a cavity partially exposing the integrated circuit.

2. The method as claimed in claim 1 wherein injecting the encapsulation includes injecting the encapsulation through the dispense port with the hole connected to a vacuum suction.

3. The method as claimed in claim 1 wherein:
    providing the package carrier includes providing the package carrier having more than one of the dispense port; and
    injecting the encapsulation includes injecting the encapsulation through the more than one of the dispense port.

4. A method of manufacture, of an integrated circuit packaging system comprising:
    providing a package carrier having a dispense port;
    attaching an integrated circuit to the package carrier with an internal interconnect, the integrated circuit over the dispense port;
    attaching an exposed interconnect to the package carrier;
    placing a mold chase over the integrated circuit and on the package carrier, the mold chase having a hole; and
    forming an encapsulation through the dispense port or the hole, the encapsulation surrounding the integrated circuit and the internal interconnect including completely filled in a space between the integrated circuit and the package carrier, and in a portion of the hole, the encapsulation having an elevated portion or a removal surface resulting from the elevated portion detached and a portion of the exposed interconnect exposed from the encapsulation.

5. The method as claimed in claim 4 further comprising mounting an interposer over the integrated circuit, the interposer partially exposed from the encapsulation.

6. The method as claimed in claim 4 further comprising attaching a heat sink to the integrated circuit, the heat sink over the encapsulation.

7. The method as claimed in claim 4 wherein attaching the integrated circuit includes attaching a flip chip to the package carrier.

8. An integrated circuit packaging system comprising:
    a package carrier having a dispense port;
    an integrated circuit attached to the package carrier and over the dispense port;

an encapsulation surrounding the integrated circuit including a space between the integrated circuit and the package carrier, and in a portion of the dispense port, the encapsulation having an elevated portion or a removal surface on a top surface of the encapsulation and resulting from the elevated portion detached; and wherein:

the encapsulation has a cavity partially exposing the integrated circuit.

9. The system as claimed in claim 8 wherein the encapsulation is completely filled in a space between the package carrier and the integrated circuit.

10. The system as claimed in claim 8 wherein the encapsulation is exposed within the dispense port.

11. The system as claimed in claim 8 wherein:

the package carrier has more than one of the dispense port; and the encapsulation is within the more than one of the dispense port.

12. The system as claimed in claim 8 wherein:

the integrated circuit attached to the package carrier includes an internal interconnect attached to the package carrier and the integrated circuit; and the encapsulation covers the internal interconnect.

13. The system as claimed in claim 12 further comprising an interposer over the integrated circuit, the interposer partially exposed from the encapsulation.

14. The system as claimed in claim 12 further comprising a heat sink attached to the integrated circuit and over the encapsulation.

15. The system as claimed in claim 12 further comprising an exposed interconnect attached to the package carrier, a portion of the exposed interconnect exposed from the encapsulation.

16. The system as claimed in claim 12 wherein the integrated circuit is a flip chip attached to the package carrier.

* * * * *